United States Patent
Lee

(10) Patent No.: US 9,379,733 B1
(45) Date of Patent: Jun. 28, 2016

(54) SYNCHRONOUS MODULATION RESONATOR WITH SIGMA DELTA MODULATOR

(71) Applicant: mCube, Inc., San Jose, CA (US)

(72) Inventor: Te-Hsi Terrence Lee, San Jose, CA (US)

(73) Assignee: MCUBE, INC., San Jose, CA (US)

( * ) Notice: Subject to any disclaimer, the term of this patent is extended or adjusted under 35 U.S.C. 154(b) by 0 days.

(21) Appl. No.: 14/794,722

(22) Filed: Jul. 8, 2015

Related U.S. Application Data

(60) Provisional application No. 61/022,173, filed on Jul. 8, 2014.

(51) Int. Cl.
*H03M 3/00* (2006.01)
*H03H 9/24* (2006.01)
*G01C 19/5776* (2012.01)

(52) U.S. Cl.
CPC ........... *H03M 3/458* (2013.01); *G01C 19/5776* (2013.01); *H03H 9/2426* (2013.01); *H03M 3/30* (2013.01)

(58) Field of Classification Search
CPC . H03H 9/2426; G01C 19/5776; H03M 3/458; H03M 3/30

USPC ................................................... 341/143, 155
See application file for complete search history.

(56) References Cited

U.S. PATENT DOCUMENTS

| 8,476,970 | B2* | 7/2013 | Mokhtar | G01C 19/5776 327/552 |
| 8,629,731 | B2* | 1/2014 | Koning | H03H 9/2426 331/116 R |
| 8,826,742 | B2* | 9/2014 | Nakamura | B81B 3/0021 73/777 |
| 8,952,891 | B2* | 2/2015 | Tanbakuchi | B82Y 35/00 324/658 |

* cited by examiner

*Primary Examiner* — Brian Young
(74) *Attorney, Agent, or Firm* — Richard T. Ogawa; Ogawa P.C.

(57) ABSTRACT

A Synchronous Modulation Resonator (SMR) device, the device includes a resonator having coupled to a Vd source and a Vr source, wherein the Vd is DC biased, wherein the Vr is AC, wherein the resonator provides a resonator output in response to Vd and Vr, a Sigma Delta Modulator (SDM) coupled to the resonator and to the Vr source, wherein the SDM provides a signal output in response to the resonator output and to the Vr, and a digital output block coupled to the SDM, wherein the digital output block is configured to provide a digital signal representation of the resonator output, in response to the signal output.

20 Claims, 4 Drawing Sheets

SYNCHRONOUS MODULATION RESONATOR WITH SIGMA DELTA MODULATOR

CROSS-REFERENCES TO RELATED APPLICATIONS

The present application is a non-provisional of provisional application No. 62/022,173 filed Jul. 8, 2014. The provisional application is hereby incorporated by reference, for all purposes.

BACKGROUND OF THE INVENTION

The present invention is directed to MEMS (Micro-Electro-Mechanical-Systems). More specifically, embodiments of the invention provide methods and structures for a Synchronous Modulation Resonator (SMR) using a Sigma Delta Modulator (SDM).

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Blackberry Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving IC devices and MEMS are highly desired.

BRIEF SUMMARY OF THE INVENTION

The present invention is directed to integrated MEMS (Micro-Electro-Mechanical-Systems) IC (Integrated Circuit) devices. More specifically, embodiments of the invention provide a method and structure of a Synchronous Modulation Resonator (SMR) using a Sigma Delta Modulator (SDM).

Embodiments of the present invention provide a Synchronous Modulation Resonator (SMR) device and method of operation therefor. The method can include providing an SMR comprising a resonator having a first input coupled to a Vd driving voltage source, the Vd driving voltage source being characterized as DC biased, a Sigma Delta Modulator (SDM) having an input coupled to an output of the resonator, the SDM having a first output coupled to a second input of the resonator and being characterized as AC biased, and a digital output having an input coupled to a second output of the SDM, the digital output block having an output. The method can further include performing a driving frequency (Fd) sweep, and determining a resonator mechanical resonant frequency (Fm) and a quality factor (Q).

MEMS motion sensors, such as accelerometers and gyroscopes, use movable proof masses to provide inertial responses to acceleration and rotation rate. Most commercial MEMS motion sensors have a mechanical resonant frequency 1 s kHz~10 s kHz, which meets consumer applications with low signal bandwidths (BW)<1 kHz.

For these types of low signal bandwidth applications, oversampling circuits are the best fit to allow long transition bands of simple anti-aliasing filters. Also, having a digital readout product is desirable for better system integration with microcontroller. A sigma delta modulator (SDM) has thus become the most popular choice to provide a modulated digital readout directly to the digital pipeline. An oversampling rate (OSR) and sinc filter order (SFO) are designed to read out sensor data with an output data rate (ODR)~1 kHz to cover the BW.

Mechanical resonant frequency (Fm) and quality factor (Q) are critical sensor parameters, which serve as key indicators of sensor functionality and process monitoring. To determine the Fm and Q of a digital readout motion sensor with open-loop operation in a production test, the movable proof mass of the sensor needs to be driven with driving frequency (Fd) while operating as a resonator. Fm and Q are then determined by sweeping Fd.

For the resonator operation with SDM, the drive node is biased with a driving voltage (Vd) with a driving frequency (Fd). The resonator is biased with a resonator driving voltage (Vr) with resonator biasing frequency (Fr). The SDM is operated with operating voltage (Vs) with sampling frequency (Fs).

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to integrated MEMS (Micro-Electro-Mechanical-Systems) IC (Integrated Circuit) devices. More specifically, embodiments of the invention provide a method and structure of a Synchronous Modulation Resonator (SMR) using a Sigma Delta Modulator (SDM). Merely by way of example, this resonator can be implemented in a MEMS gyroscope, MEMS accelerometer, or other MEMS devices. But it will be recognized that the invention has a much greater range of applicability.

Conventional resonator operation with a Sigma Delta Modulator (SDM) produces unstable output, which cannot serve as a reliable production test. Embodiments of the present invention provide a novel Synchronous Modulation Resonator (SMR) operation with SDM, which can serve as a reliable production test to determine resonator Fm and Q. This invention also discloses a novel Accelerated Synchronous Modulation Resonator (ASMR) operation with SDM, which can serve as a fast and reliable production test to determine resonator Fm and Q.

Figure 1:
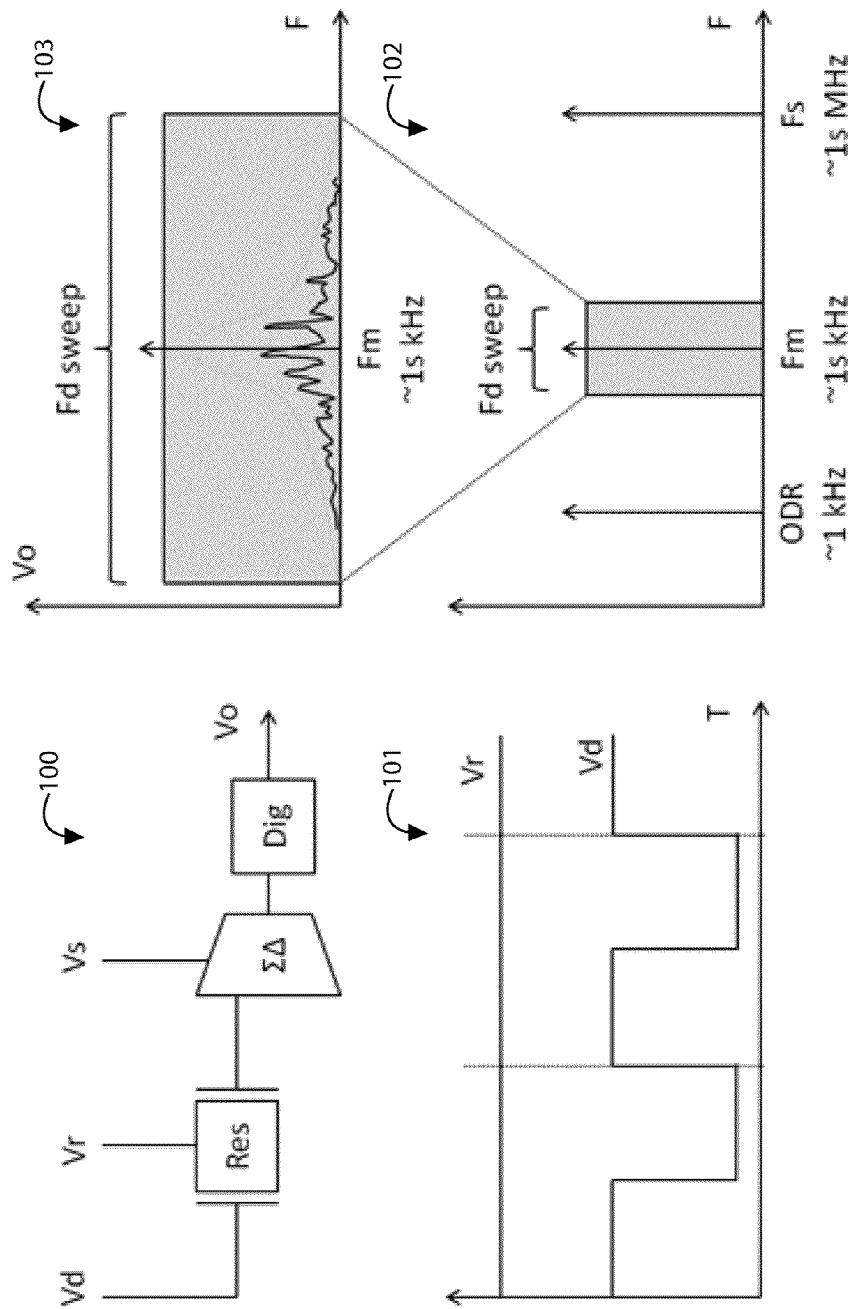
FIG. 1 shows a conventional MEMS resonator with graphs of associated data read out.

FIG. 1 shows a conventional MEMS resonator with graphs of associated data read out. Block diagram 100 shows a regular MEMS resonator (100) operation with an SDM (IA). The resonator (Res) is coupled in series to the SDM and the Digital output (Dig). As shown in graph 101, Vr is DC biased while Vd is AC biased. Graph 102 shows an Fd sweep near Fm of the resonator to determine Fm and Q. A close up is shown in graph 103. The mechanical resonance of the resonator occurs as Fd=Fm. However, as ODR is much smaller than Fd near Fm, the output Vo is strongly aliased and this unstable output cannot be used as reliable production test.

Figure 2:
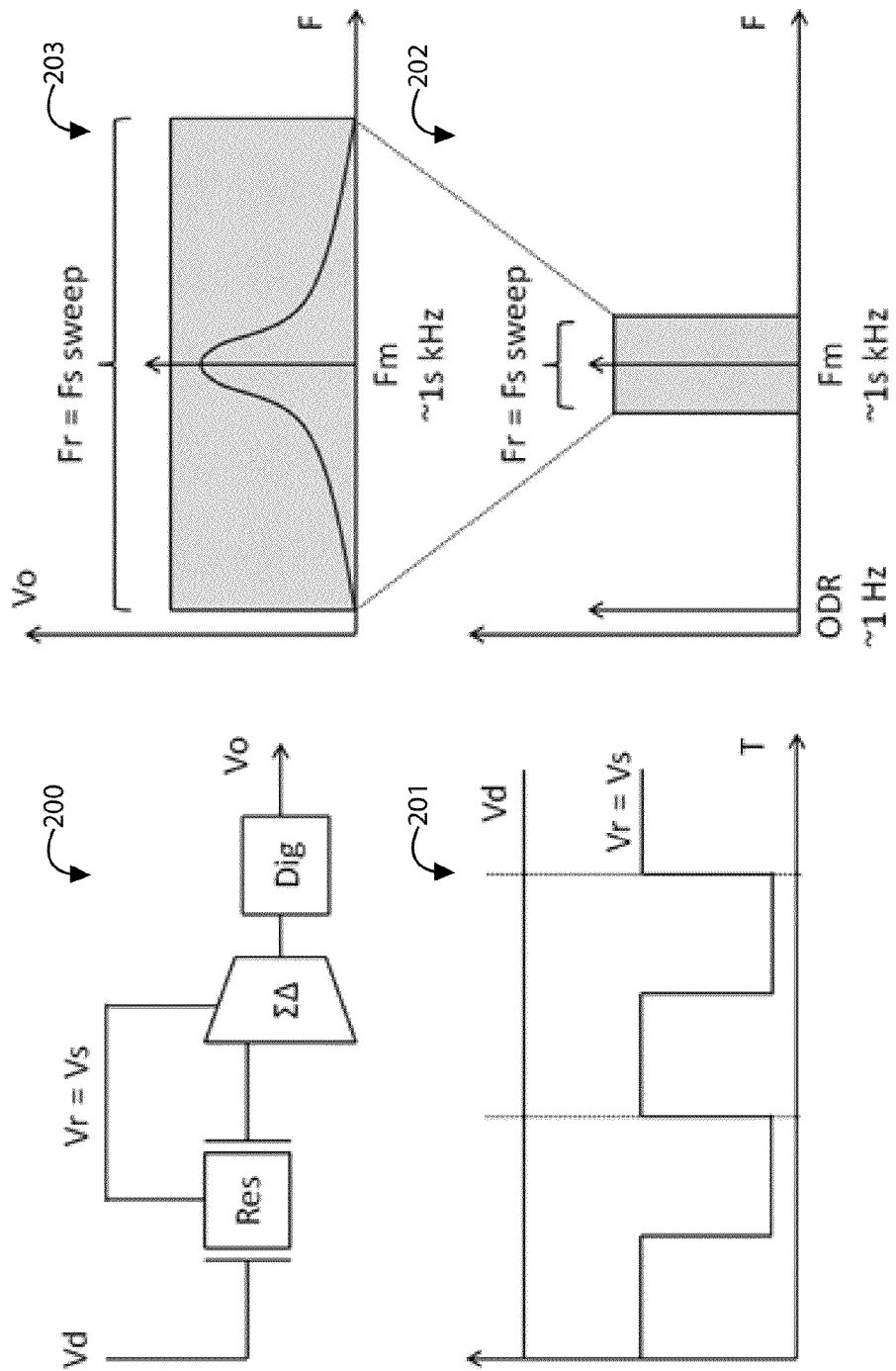
FIG. 2 is a simplified diagram illustrating a Synchronous Modulation Resonator (SMR) operating with a Sigma Delta Modulator (SDM) and with graphs of associated data read out according to an embodiment of the present invention.

FIG. 2 is a simplified diagram illustrating a Synchronous Modulation Resonator (SMR) operating with a Sigma Delta Modulator (SDM) and with graphs of associated data read out according to an embodiment of the present invention. Block diagram 200 shows a MEMS resonator (Res) coupled to an SDM (ΣΔ) and to a Digital readout (Dig). As configured, Vr=Vs, which is shown as a common input to the SDM and to the Res.

Graph 201 shows Vd is DC biased and Vr is AC biased. Graph 202 shows a sweep near Fm of the resonator, with Fr=Fs. Graph 203 shows a close up of the Fr=Fs sweep near Fm. With this operation the resonator is driven with Fr and synchronized with the SDM, so that the SDM readout locked-in with the frequency and phase of resonator, which provides a stable output without aliasing even with low ODR, and can serve as a fast and reliable production test to determine resonator Fm and Q. The mechanical resonance of the resonator occurs as Fs=Fm.

Note that, in principal, this SMR operation lowers Fs near Fm (~1 s MHz→~1 s kHz). To maintain SDM OSR, the ODR=Fs/(OSR*SFO) is also reduced (~1 kHz→~1 Hz), which can increase test time of frequency sweep (~10 s msec~10 s sec).

Figure 3:
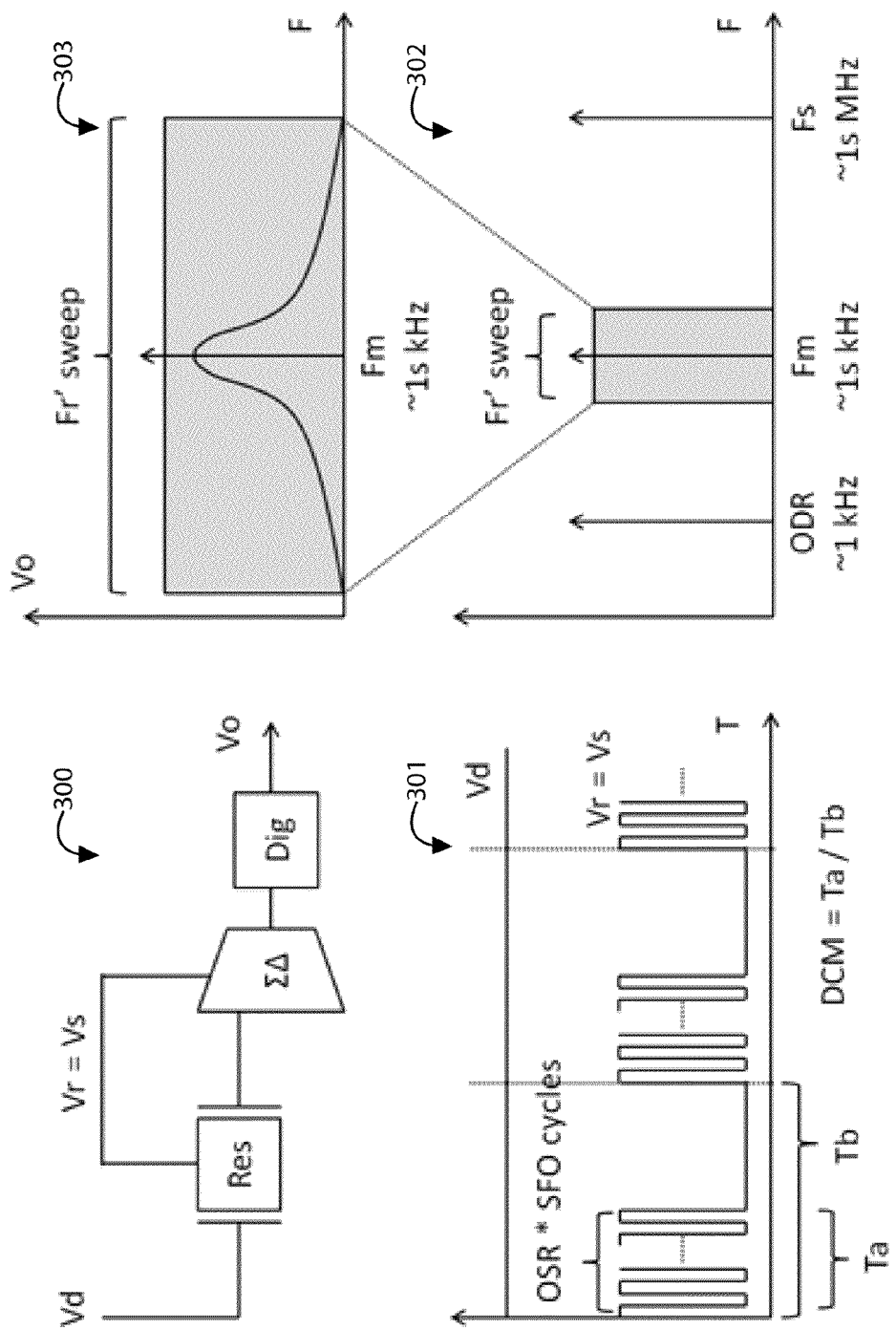
FIG. 3 is a simplified diagram illustrating an Accelerated Synchronous Modulation Resonator (ASMR) operating with a Sigma Delta Modulator (SDM) and with graphs of associated data read out according to an embodiment of the present invention.

FIG. 3 is a simplified diagram illustrating an Accelerated Synchronous Modulation Resonator (ASMR) operating with a Sigma Delta Modulator (SDM) and with graphs of associated data read out according to an embodiment of the present invention. Block diagram 300 shows a MEMS resonator (Res) coupled to an SDM (ΣΔ) and to a Digital readout (Dig), similar to FIG. 2. As configured, Vr=Vs, which is shown as a common input to the SDM and to the Res.

However, graph 301 shows that Vd is DC biased and Vr is AC biased and duty-cycle modulated (DCM). Similar to FIG. 2, graph 302 shows a sweep near Fm of the resonator, with Fr=Fs. Instead of frequency Fr>>Fm, the driving portion composed of OSR*SFO cycles serve as an equivalent DC driving, and thus the resonator is primarily driven with duty-cycle modulated driving frequency (Fr'), which correlated with OSR and SFO: Fr'=Fr/(OSR*SFO). The mechanical resonance of the resonator occurs as Fr'=Fm and Fs=Fm*(OSR*SFO). This ASMR operation can determine the target Fm and Q, while maintaining Fs in original high frequency range (~1 s MHz) and accordingly high ODR=DCM*Fs/(OSR*SFO).

Figure 4A:
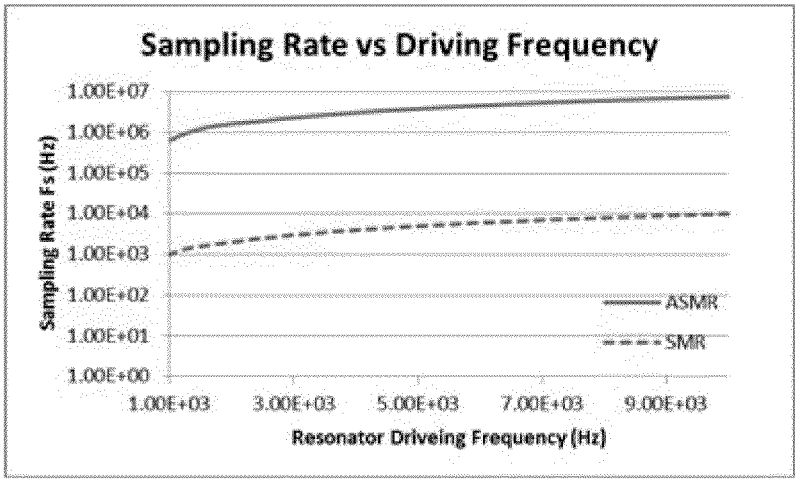
FIGS. 4A-4C are simplified graphs comparing characteristics of the SMR and ASMR according to embodiments of the present invention.
Figure 4B:
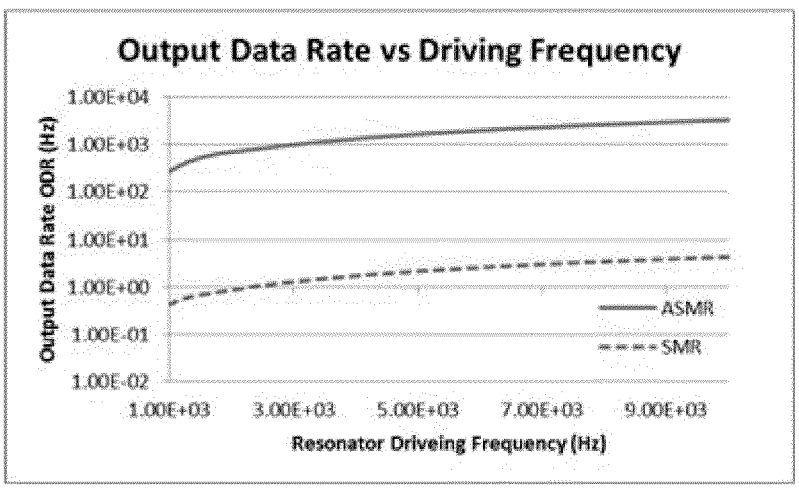
Figure 4C:
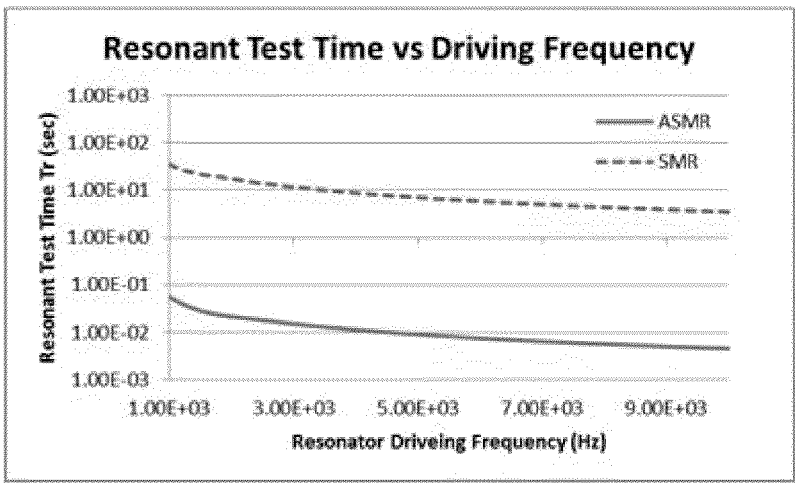

FIGS. 4A-4C are simplified graphs comparing characteristics of the SMR and ASMR according to embodiments of the present invention. Graph 401 of FIG. 4A shows sampling rate vs. driving frequency. Graph 402 of FIG. 4B shows output data rate vs. driving frequency. And graph 403 of FIG. 4C shows resonant test time vs. driving frequency. These figures show the ODR and resonance test time comparison of SMR and ASMR, with parameters OSR=256, SFO=3, DCM=33%, frequency sweep point=15. For a resonator with Fm=5 kHz, SMR operate with Fs=5 kHz, ODR=2.15 Hz, test time=6.98 sec; ASMR operate with Fs=3.85 MHz, ODR=1.65 kHz, test time=9.07 msec. The comparison shows the near three order of resonance test time improvement by using ASMR, which can serve as a fast and reliable production test to determine resonator Fm and Q.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A Synchronous Modulation Resonator (SMR) device, the device comprising:
    a resonator having a first input coupled to a Vd driving voltage source and a Vr resonator biasing voltage source, wherein the Vd driving voltage source is characterized as DC biased, wherein the Vr resonator biasing voltage source is characterized as AC biased, wherein the resonator is configured to provide a resonator output in response to Vd from the Vd driving voltage source and Vr from the Vr resonator biasing voltage source;
    a Sigma Delta Modulator (SDM) coupled to the resonator, wherein the SDM is coupled to the Vr resonator biasing voltage source, and wherein the SDM is configured to provide a signal output in response to the resonator output and to the Vr of the Vr resonator biasing voltage source; and a digital output block coupled to the SDM, wherein the digital output block is configured to provide a digital signal representation of the resonator output, in response to the signal output.

2. The device of claim 1 wherein the signal output of the SDM being is synchronized with the resonator output of the resonator.

3. The device of claim 1 wherein the Vr resonator biasing voltage source is configured to output the Vr characterized by a duty-cycle modulation (DCM).

4. The device of claim 3 wherein DCM characterization is characterized by a product of oversampling rate (OSR)*sinc filter order (SFO) cycles.

5. The device of claim 1 being configured for a production test mode to determine resonator mechanical resonant frequency (Fm) and quality factor (Q).

6. The device of claim 1 being configured for low signal bandwidth (BW) operation of <1 kHz.

7. The device of claim 1 wherein the resonator comprises a MEMS device.

8. The device of claim 6 wherein the MEMS device is selected from a group consisting of: an accelerometer and a gyroscope.

9. The device of claim 1 wherein the Vr is characterized by a first frequency and a second frequency, wherein the first frequency comprises a resonator biasing voltage frequency associated with the resonator, and wherein the second frequency comprising a SDM sampling frequency associated with the SDM.

10. The device of claim 9 wherein the first frequency and the second frequency are different within a range of about two to about three orders of magnitudes.

11. A method for operating a Synchronous Modulation Resonator (SMR) device, the method comprising:
   providing an SMR comprising
      a resonator having a first input coupled to a Vd driving voltage source and a second input coupled to a Vr resonator biasing voltage source, wherein a Vd of the Vd driving voltage source being characterized as DC biased, and wherein the Vr of the Vr resonator biasing voltage source is characterized as AC biased, and wherein the resonator provides a resonator output,
      a Sigma Delta Modulator (SDM) coupled to the resonator and to the Vr resonator biasing voltage source, wherein the SDM is configured to output a signal output in response to the resonator output and to the Vr, and
      a digital output coupled to the SDM, wherein the digital output is configured is configured to provide a digital signal representation of the resonator output, in response to the signal output;
   modifying a frequency Fr of the Vr of the Vr resonator biasing voltage within a frequency sweep region; and
   determining a resonator mechanical resonant frequency (Fm) in response to the digital signal representation of the resonator output.

12. The method of claim 10 further comprising determining a quality factor (Q) associated with the resonator, in response to the digital signal representation of the resonator output.

13. The method of claim 10 further comprising:
   driving the SDM with the Vr of the Vr resonator biasing voltage; and
   driving the resonator with the Vr of the Vr resonator biasing voltage.

14. The method of claim 11 wherein the Vr of the Vr resonator biasing voltage is characterized as duty-cycle modulated (DCM).

15. The method of claim 14 wherein the DCM characterization includes oversampling rate (OSR)*sinc filter order (SFO) cycles.

16. The method of claim 8 wherein determining the resonator mechanical resonant frequency (Fm) comprises maintaining Fr when the digital signal representation of the resonator output provides an output peak.

17. The method of claim 11 wherein determining the resonator mechanical resonant frequency (Fm) comprises slowly modifying the Fr when the digital signal representation of the resonator output increases.

18. The method of claim 11 further comprising in the Vr resonator biasing voltage source combining a signal comprising the resonator biasing voltage frequency and a signal comprising the SDM sampling frequency.

19. The method of claim 18 wherein the first frequency and the second frequency are different within a range of about two to about three orders of magnitudes.

20. The method of claim 11 wherein modifying the frequency Fr of the Vr comprises modifying the resonator biasing voltage frequency while maintaining the SDM sampling frequency.

* * * * *